(12) United States Patent
Sundaresan et al.

(10) Patent No.: US 10,424,358 B2
(45) Date of Patent: Sep. 24, 2019

(54) BIAS CONTROL CIRCUIT WITH DISTRIBUTED ARCHITECTURE FOR MEMORY CELLS

(71) Applicant: SanDisk Technologies LLC, Plano, TX (US)

(72) Inventors: Supraja Sundaresan, San Jose, CA (US); Sung-en Wang, San Jose, CA (US); Khin Htoo, Sunnyvale, CA (US); Primit Modi, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/870,486

(22) Filed: Jan. 12, 2018

(65) Prior Publication Data
US 2018/0358069 A1 Dec. 13, 2018

Related U.S. Application Data

(60) Provisional application No. 62/612,116, filed on Dec. 29, 2017, provisional application No. 62/518,590, filed on Jun. 12, 2017.

(51) Int. Cl.
*G11C 5/14* (2006.01)
*G11C 11/16* (2006.01)
(Continued)

(52) U.S. Cl.
CPC .......... *G11C 11/161* (2013.01); *G11C 5/147* (2013.01); *G11C 8/08* (2013.01); *G11C 11/1653* (2013.01);
(Continued)

(58) Field of Classification Search
CPC ... G11C 11/161; G11C 5/147; G11C 11/1653; G11C 11/1657; G11C 11/1659
(Continued)

(56) References Cited

U.S. PATENT DOCUMENTS

| 4,615,020 A | 9/1986 | Rinerson et al. |
| 4,677,592 A | 6/1987 | Sakurai et al. |

(Continued)

FOREIGN PATENT DOCUMENTS

WO    WO-02/078003 A2    10/2002

OTHER PUBLICATIONS

Sun, et al., "A new bias scheme for a low power consumption ReRAM crossbar array," Semiconductor Science and Technology, Aug. 2016, vol. 31, Issue 8.
(Continued)

*Primary Examiner* — Huan Hoang
(74) *Attorney, Agent, or Firm* — Foley & Lardner LLP

(57) ABSTRACT

Disclosed is a device including a selected distributed driver, a first feedback control circuit, and a second feedback control circuit. The first feedback control circuit is coupled to the selected distributed driver. The first feedback control circuit is configured to maintain an output of the selected distributed driver within a first predetermined range. The second feedback control circuit is selectively coupled to the selected distributed driver and is configured to maintain the output of the selected distributed driver to be within a second predetermined range. The second predetermined range is within the first predetermined range.

18 Claims, 9 Drawing Sheets

(51) Int. Cl.
*G11C 13/00* (2006.01)
*G11C 16/08* (2006.01)
*G11C 16/30* (2006.01)
*G11C 11/22* (2006.01)
*G11C 8/08* (2006.01)

(52) U.S. Cl.
CPC ...... *G11C 11/1655* (2013.01); *G11C 11/1657* (2013.01); *G11C 11/1659* (2013.01); *G11C 11/1673* (2013.01); *G11C 11/1675* (2013.01); *G11C 11/1697* (2013.01); *G11C 11/2253* (2013.01); *G11C 11/2297* (2013.01); *G11C 13/0023* (2013.01); *G11C 13/0026* (2013.01); *G11C 13/0028* (2013.01); *G11C 13/0038* (2013.01); *G11C 13/0069* (2013.01); *G11C 16/08* (2013.01); *G11C 16/30* (2013.01); *G11C 2213/71* (2013.01)

(58) Field of Classification Search
USPC .................................................. 365/189.09
See application file for complete search history.

(56) References Cited

U.S. PATENT DOCUMENTS

| | | | |
|---|---|---|---|
| 5,500,817 A * | 3/1996 | McLaury | G11C 7/1051 326/27 |
| 5,801,992 A | 9/1998 | Hirano | |
| 6,058,060 A | 5/2000 | Wong | |
| 6,724,664 B2 * | 4/2004 | Takahashi | G11C 8/08 327/108 |
| 6,826,079 B2 | 11/2004 | Tran | |
| 7,911,823 B2 | 3/2011 | Futatsuyama et al. | |
| 8,897,064 B2 | 11/2014 | Chen et al. | |
| 9,036,401 B2 | 5/2015 | Meade et al. | |
| 9,076,523 B2 | 7/2015 | Lee et al. | |
| 9,224,464 B2 | 12/2015 | Chou et al. | |
| 9,633,723 B2 | 4/2017 | Nguyen et al. | |
| 2003/0002338 A1 | 1/2003 | Xu et al. | |
| 2004/0071037 A1 * | 4/2004 | Gallo | G11C 7/1021 365/230.03 |
| 2004/0141394 A1 | 7/2004 | Nishida et al. | |
| 2005/0185572 A1 | 8/2005 | Resta et al. | |
| 2005/0254302 A1 | 11/2005 | Noguchi | |
| 2006/0157679 A1 | 7/2006 | Scheuerlein | |
| 2010/0038695 A1 | 2/2010 | Luk et al. | |
| 2016/0111161 A1 | 4/2016 | Louie et al. | |

OTHER PUBLICATIONS

Zhao, et al., "Design and analysis of crossbar architecture based on complementary resistive switching non-volatile memory cells," Journal of Parallel and Distributed Computing, Aug. 11, 2013, pp. 2484-2496, vol. 74.

* cited by examiner

BIAS CONTROL CIRCUIT WITH DISTRIBUTED ARCHITECTURE FOR MEMORY CELLS

CROSS-REFERENCE TO RELATED APPLICATION

The present application claims priority to U.S. Provisional Application No. 62/612,116 filed on Dec. 29, 2017, and U.S. Provisional Application No. 62/518,590 filed on Jun. 12, 2017, all of which are incorporated by reference herein in their entirety.

BACKGROUND

The following description is provided to assist the understanding of the reader. None of the information provided or references cited is admitted to be prior art.

The operation of memory devices includes the application of voltages or currents to memory cells. Writing data to the memory cells or reading the stored data includes applying different voltages at different phases. For example, various phases of writing data in a resistive memory device may include a set phase, a reset phase, a verification phase, a standby phase, etc. A bias control circuit may bias different components of the memory cells at corresponding voltages during different phases. To ensure correct operations of the memory devices, voltages from the bias control circuit may be settled within a settling time period during each phase. Increase in the settling time may cause delays in the operation speed of the memory devices.

SUMMARY

Various embodiments are related to a selected distributed driver, a first feedback control circuit, and a second feedback control circuit. The first feedback control circuit is coupled to the selected distributed driver. The first feedback control circuit is configured to maintain an output of the selected distributed driver within a first predetermined range. The second feedback control circuit is selectively coupled to the selected distributed driver and is configured to maintain the output of the selected distributed driver to be within a second predetermined range. The second predetermined range is within the first predetermined range.

In one or more embodiments, the first feedback control circuit is disabled responsive to the output of the selected distributed driver being within the predetermined range.

In one or more embodiments, the selected distributed driver is coupled to a set of memory cells, the selected distributed driver to bias the set of memory cells according to the output of the selected distributed driver. The device may further include another distributed driver. Said another distributed driver may be coupled to another set of memory cells. Said another distributed driver may be configured to bias said another set of memory cells according to an output of said another distributed driver. The first feedback control circuit may be configured to stabilize the output of the selected distributed driver in transition while the output of said another distributed driver is maintained at a predetermined voltage level.

In one or more embodiments, the device further includes a plurality of memory cells divided into one or more stripes. Each stripe of the one or more stripes comprises corresponding bays of memory cells, a plurality of distributed drivers, and a stripe controller including DC control circuits. Each distributed driver of the plurality of distributed drivers may be coupled to a corresponding bay of the bays of memory cells. The DC control circuits may include the second feedback control circuit, and the second feedback control circuit may be selectively coupled to the selected distributed driver from a set of the plurality of distributed drivers associated with a stripe.

In one or more embodiments, the first feedback control circuit comprises a first N-type transistor and a first P-type transistor. The first N-type transistor may include a gate terminal coupled to an input of the first feedback control circuit. An increase in a voltage at the gate terminal of the first N-type transistor may cause an increase in a voltage of the output of the first feedback control circuit. The first P-type transistor may include a source terminal coupled to a source terminal of the first N-type transistor. A decrease in a voltage at a gate terminal of the first P-type transistor may cause a decrease in the voltage of the output of the first feedback control circuit.

In one or more embodiments, the first feedback control circuit further comprises a first voltage rail to supply a first supply voltage, and a second voltage rail to supply a second supply voltage. The second supply voltage may be lower than the first supply voltage. The first N-type transistor may be coupled between the first voltage rail and the first P-type transistor. The first P-type transistor may be coupled between the second voltage rail and the first N-type transistor.

In one or more embodiments, the first feedback control circuit further comprises a second N-type transistor in a diode connected configuration and a second P-type transistor in a diode connected configuration. The second N-type transistor may include a source terminal coupled to the input of the first feedback control circuit, and a drain terminal coupled to the gate terminal of the first N-type transistor. The second P-type transistor may include a source terminal coupled to the source terminal of the second N-type transistor, and a drain terminal coupled to the gate terminal of the first P-type transistor. The first feedback control circuit may further include a first resistor and a second resistor. The first resistor may be coupled between the drain terminal of the second N-type transistor and a gate terminal of the second N-type transistor. The second resistor may be coupled between the drain terminal of the second P-type transistor and a gate terminal of the second P-type transistor. The first resistor and the second resistor may be configured to disable the first N-type transistor and the first P-type transistor, responsive to the output of the selected distributed driver being within the predetermined range.

In one or more embodiments, the first feedback control circuit further includes a P-type current mirror circuit and a N-type current mirror circuit. The P-type current mirror circuit may be coupled to a drain terminal of the first N-type transistor. The P-type current mirror circuit may be configured to increase source current at the output of the selected distributed driver to increase the voltage of the output of the selected distributed driver, in response to the increase in the voltage at the gate terminal of the first N-type transistor. The N-type current mirror circuit may be coupled to a drain terminal of the first P-type transistor. The N-type current mirror circuit may be configured to increase sink current at the output of the selected distributed driver to decrease the voltage of the output of the selected distributed driver, in response to the decrease in the voltage at the gate terminal of the first P-type transistor.

In one or more embodiments, the first feedback control circuit further includes a sense transistor in a source follower configuration. The sense transistor may include a gate terminal coupled to the output of the selected distributed driver, and a source terminal coupled to the source terminal of the first N-type transistor and the source terminal of the first P-type transistor.

Various embodiments are related to a circuit including an input to receive a reference voltage, an output to supply an output voltage corresponding to the reference voltage to a memory cell, a first N-type transistor including a gate terminal coupled to the input of the circuit, and a first P-type transistor including a source terminal coupled to a source terminal of the first N-type transistor. An increase in a voltage at the gate terminal of the first N-type transistor causes an increase in the output voltage, and a decrease in a voltage at a gate terminal of the first P-type transistor causes a decrease in the output voltage.

In one or more embodiments, the circuit further includes a first voltage rail to supply a first supply voltage, and a second voltage rail to supply a second supply voltage. The second supply voltage is lower than the first supply voltage. The first N-type transistor may be coupled between the first voltage rail and the first P-type transistor, and the first P-type transistor may be coupled between the second voltage rail and the first N-type transistor.

In one or more embodiments, the circuit further includes a second N-type transistor in a diode connected configuration and a second P-type transistor in a diode connected configuration. The second N-type transistor may include a source terminal coupled to the input, and a drain terminal coupled to the gate terminal of the first N-type transistor. The second P-type transistor may include a source terminal coupled to the source terminal of the second N-type transistor, and a drain terminal coupled to the gate terminal of the first P-type transistor. The circuit may further include a first resistor coupled between the drain terminal of the second N-type transistor and a gate terminal of the second N-type transistor, and a second resistor coupled between the drain terminal of the second P-type transistor and a gate terminal of the second P-type transistor. The first resistor and the second resistor may be configured to disable the first N-type transistor and the first P-type transistor, responsive to the output voltage being within a predetermined range.

In one or more embodiments, the circuit further includes a P-type current mirror circuit coupled to a drain terminal of the first N-type transistor and a N-type current mirror circuit coupled to a drain terminal of the first P-type transistor. The P-type current mirror circuit may be configured to increase source current at the output to increase the output voltage, in response to the increase in the voltage at the gate terminal of the first N-type transistor. The N-type current mirror circuit may be configured to increase sink current at the output to decrease the output voltage, in response to the decrease in the voltage at the gate terminal of the first P-type transistor.

In one or more embodiments, the circuit further includes a sense transistor in a source follower configuration. The sense transistor may include a gate terminal coupled to the output, and a source terminal coupled to the source terminal of the first N-type transistor and the source terminal of the first P-type transistor.

Various embodiments are related to a method including selecting a distributed driver from a plurality of distributed drivers. Each of the plurality of distributed drivers may be coupled to a corresponding first feedback control circuit. The method further includes causing, by a first feedback control circuit coupled to the selected distributed driver, an output of the selected distributed driver to be within a predetermined range. The method further includes disabling the first feedback control circuit in response to the output of the selected distributed driver being within the predetermined range. The method further includes causing, by a second feedback control circuit, the output of the selected distributed driver to be within a second predetermined range. The second predetermined range is within the first predetermined range. The second feedback control circuit may be selectively coupled to the selected distributed driver.

The foregoing summary is illustrative and is not intended to be in any way limiting. In addition to the illustrative aspects, embodiments, and features described above, further aspects, embodiments, and features will become apparent by reference to the following drawings and the detailed description.

Figure 1:
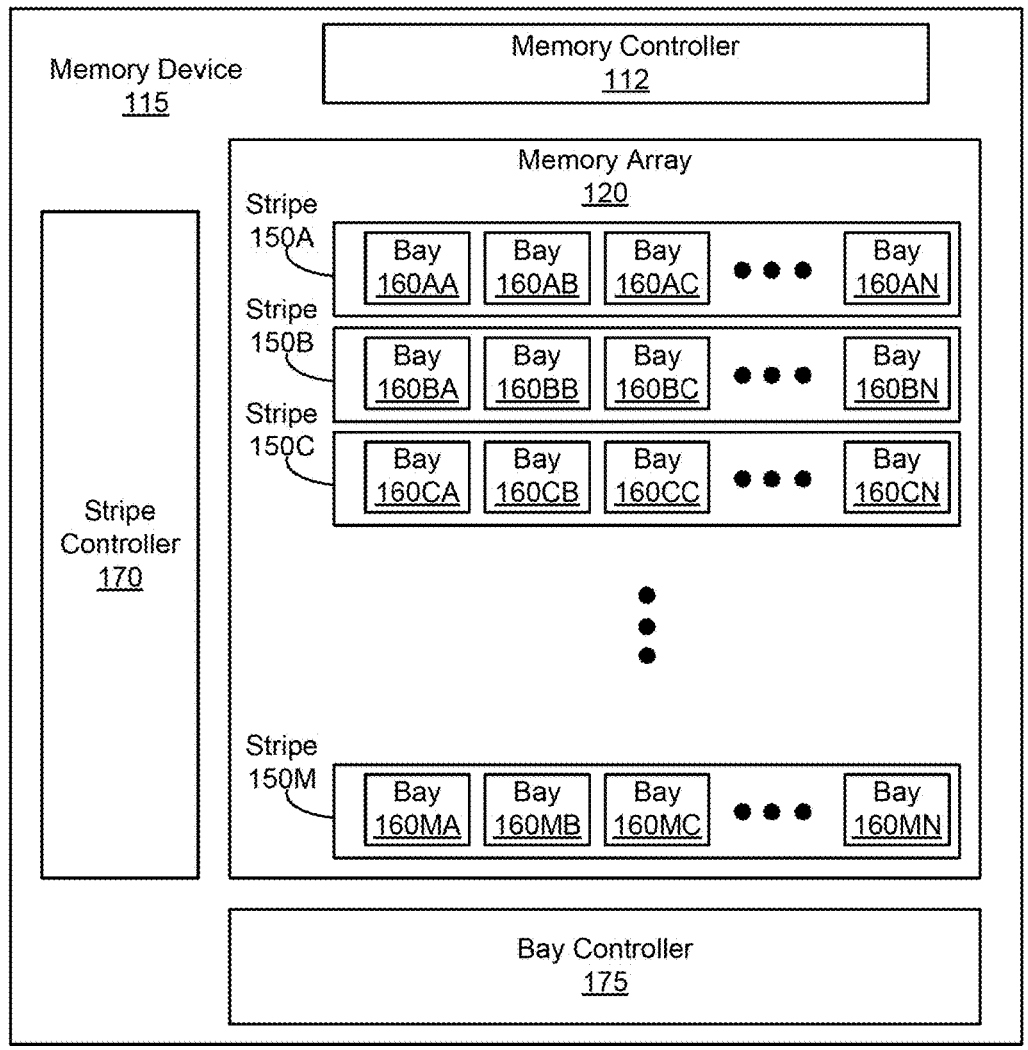
FIG. 1 is a block diagram of a memory device according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments disclosed herein are related to a memory device including a first feedback control circuit and a second feedback control circuit to control voltages or currents applied to memory cells. Distributed drivers may provide voltages or currents to corresponding memory cells. A distributed driver may be any circuit coupled to corresponding memory cells to provide one or more voltages or currents to the memory cells. The distributed drivers may be coupled to respective feedback control circuits. For example, the distributed drivers are coupled to a first feedback control circuit that controls a voltage or a current provided to a memory cell to be within a first predetermined range (e.g., hundreds of millivolts). The first feedback control circuit may have low internal impedances (e.g., 1/gm) with amplification obtained through current mirroring. Hence, the first feedback control circuit can achieve high unity gain bandwidth and respond to high frequency input (e.g., over hundred megahertz). The distributed drivers are also coupled to a second feedback control circuit that controls the voltage or the current of the distributed driver to be within a second predetermined range. The second predetermined range (e.g., tens of millivolts) may be less than the first predetermined range. In one aspect, the first feedback control circuit is faster than the second feedback control circuit operating up to, for example, tens of kilohertz, but may be less accurate than the second feedback control circuit.

Advantageously, the disclosed memory device can operate with improved speed and accuracy as compared to traditional memory devices. In one aspect, the distributed driver adjusts voltages or currents provided to a memory cell during different phases. The first feedback control circuit may control the voltage or the current provided to the memory cell to be within the first predetermined range. Once the voltage or the current is within the first predetermined range, the second feedback control circuit may control the voltage or the current to be within the second predetermined range. The first feedback control circuit may be disabled, while the second feedback control circuit controls the voltage or current to be within the second predetermined range. Accordingly, the voltage or the current provided to the memory cell can be adjusted with a reduced settling time, thereby improving the operating speed and accuracy of the memory device.

FIG. 1 is a block diagram of one embodiment of a memory device 115. The memory device 115, in various embodiments, may be disposed in a computing device. In one embodiment, the memory device 115 includes a memory controller 112, a stripe controller 170, a bay controller 175, and the memory array 120. These components operate together to receive electronic data from a host processor (not shown), store the electronic data, and output the stored data to the host processor. In other embodiments, the memory device 115 includes more, fewer, or different components than shown in FIG. 1.

The memory array 120 is a component that stores electronic data. In one aspect, the memory array 120 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory array 120 includes a plurality of memory cells divided into bays 160 and stripes 150. A stripe 150 is a group of bays 160, where a bay 160 is a group of memory cells. The memory cells can be formed from passive and/or active elements, in any combinations. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may also be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In one embodiment, a stripe controller 170 controls a stripe 150 of bays 160, while a bay controller 175 controls each bay 160 individually. Each of the stripe controller 170 and the bay controller 175 may be implemented as a field programmable gate array, application specific integrated circuit, or a combination of them. Detailed implementations and operations of the stripe controller 170 and the bay controller 175 are provided below with respect to FIGS. 3 through 8 below.

The memory controller 112 is an interface circuit that interfaces with the external host processor and internal components of the memory device 115 (e.g., the stripe controller 170 and the bay controller 175). The memory controller 112 may be coupled to the host processor through a bus. In addition, the memory controller 112 may be coupled to the stripe controller 170 and the bay controller 175 through conductive wires or traces on a printed circuit board or a flexible circuit board. For the writing operation, the memory controller 112 may receive electronic data to be stored, a target address of the memory array 120, and an instruction to store the electronic data from the host processor. In response to the instruction to store the electronic data, the memory controller 112 may configure the stripe controller 170 and the bay controller 175 to store the electronic data at the target address. For the reading operation, the memory controller 112 may receive a target address of the memory array 120, and an instruction to read the electronic data stored by memory cells associated with the target address from the host processor. In response to the instruction to read, the memory controller 112 configures the stripe controller 170 and the bay controller 175 to retrieve the electronic data stored by the target address and to output the retrieved data to the host processor.

Figure 2:
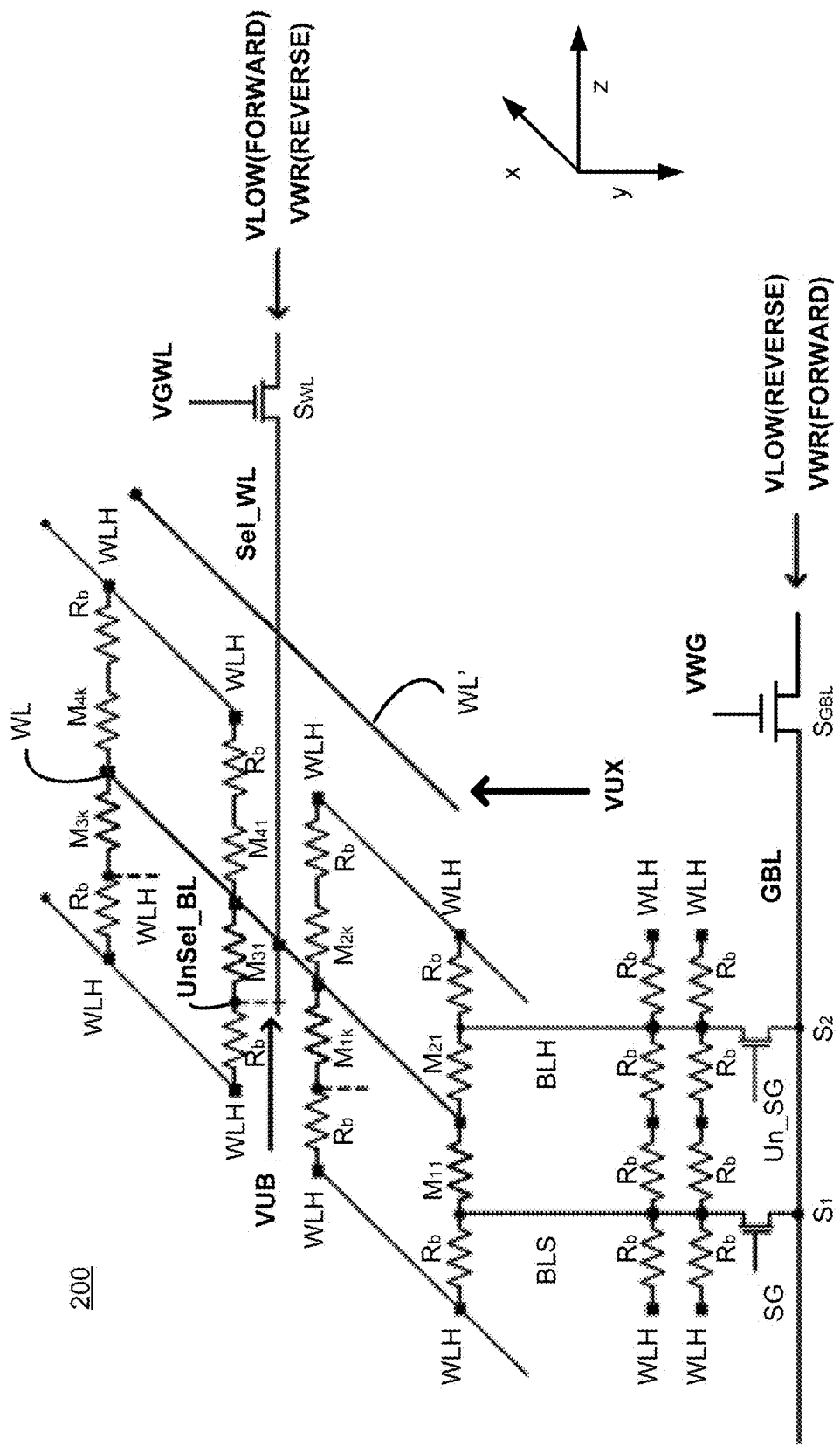
FIG. 2 is a circuit diagram of example memory cells according to an example embodiment.

Referring to FIG. 2, illustrated is a circuit diagram of example memory cells 200, according to an example embodiment. The memory cells 200 may be memory cells in a portion of the bay 160 of FIG. 1. The memory cells 200 may be memory cells of a resistive memory device. The memory cells 200 include a plurality of memory cells $M_{11} \ldots M_{1k}$, $M_{21} \ldots M_{2k}$, and $M_{31} \ldots M_{3k}$, and $M_{41} \ldots$ $M_{4k}$. A resistance value of each memory cell M can be adjusted to store input data. For example, a low resistance of a memory cell M below a threshold resistance may represent a value '0' and a high resistance of the memory cell M above the threshold resistance may represent a value '1.'

In some embodiments, the memory cells M have first ends coupled to a word line WL extending along a x-direction and second ends coupled to corresponding bit lines BLS or BLH extending along a y-direction. Each of the bit lines may be coupled to a plurality of feed resistors $R_b$, through which a voltage can be applied. Each second end of the bit line may be coupled to a switch S. The switch S is an electrical circuit that selectively couples a bit line extending along a y-direction to a global bit line GBL extending along a z-direction. The switch S may be embodied as a transistor (e.g., thin film transistor). For example, in response to a voltage SG (e.g., a voltage corresponding to logic '1') applied to a gate of the switch S, the switch S electrically couples the bit line to the global bit line GBL, and in response to a voltage Un_SG (e.g., a voltage corresponding to logic '0') applied to a gate of the switch S, the switch S electrically decouples the bit line from the global bit line GBL. The voltages SG and Un_SG are control signals for controlling the switches S. The voltages SG and Un_SG may be generated by a driving circuit (e.g., stripe controller 170 or bay controller 175). Unselected bit lines UnSel-BL may be applied with a voltage VUB. The voltage VUB is a voltage applied to an unselected bit line. The voltage VUB may be generated by a driving circuit (e.g., stripe controller 170 or bay controller 175).

Although not shown for simplicity, additional memory cells, bit lines, feed resistors and switches S may be added between another word line WL' extending along the x-direction and the global bit line GBL extending along the z-direction. For example, feed resistor $R_b$, additional memory cells, and another feed resistor $R_b$ may be coupled to the feed resistor $R_b$, memory cells $M_{11}$, $M_{21}$, and another feed resistor $R_b$ in series, with the word line WL' coupled between the additional memory cells. In some embodiments, additional bit lines, feed resistors $R_b$ and switches S may be coupled to corresponding ends of the additional memory cells and the global bit line GBL, in a similar manner as the bit lines, the feed resistors $R_b$ and switches S coupled to corresponding ends of the memory cells $M_{11}$, $M_{21}$ and the global bit line GBL.

In some embodiments, the word line WL is coupled to a switch $S_{WL}$, through which a voltage can be provided. Different word line WL' may be coupled to another switch (not shown). The switch $S_{WL}$, is an electrical circuit that selectively couples the word line WL to a driving circuit (e.g., stripe controller 170 or bay controller 175). The switch $S_{WL}$ may be embodied as a transistor (e.g., thin film transistor). For example, in response to a signal VGWL having a voltage corresponding to logic '1' applied to a gate of the switch $S_{WL}$, the switch $S_{WL}$ electrically couples the word line WL to the driving circuit, and in response to the signal VGWL having different voltage corresponding to logic '0' applied to the gate of the switch $S_{WL}$, the switch $S_{WL}$ electrically decouples the word line WL from the driving circuit. The signal VGWL is a control signal for controlling the switch $S_{WL}$. The signal VGWL may be generated by a driving circuit (e.g., stripe controller 170 or bay controller 175). When the word line WL is selected (i.e., or is coupled to the driving circuit), a signal VLOW or VWR may be supplied to the word line WL. The signals VLOW and VWR are signals applied to memory cells M for changing resistance values. The signals VLOW and VWR may be generated by a driving circuit (e.g., stripe controller 170 or bay controller 175). During a set operation to change a high resistance value of a memory cell to a low resistance value, the signal VWR may be applied to the selected word line WL, and the signal VLOW may be applied to the global bit line GBL. During a reset operation to change the low resistance value of the memory cell to the high resistance value, the signal VLOW may be applied to the selected word line WL, and the signal VWR may be applied to the global bit line GBL. When the word line WL is not selected (i.e., not coupled to the driving circuit), a voltage VUX may be supplied to the word line WL. The voltage VUX is a voltage applied to an unselected word line. The voltage VUX may be generated by a driving circuit (e.g., stripe controller 170 or bay controller 175).

In some embodiments, the global bit line GBL is coupled to a switch $S_{GBL}$, through which a voltage can be provided. The switch $S_{GBL}$ is an electrical circuit that selectively couples the global bit line GBL to a driving circuit (e.g., stripe controller 170 or bay controller 175). The switch $S_{GBL}$ may be embodied as a transistor (e.g., thin film transistor). For example, in response to a signal VWG having a voltage corresponding to logic '1' applied to a gate of the switch $S_{GBL}$, the switch $S_{GBL}$ electrically couples the global bit line GBL to the driving circuit, and in response to the signal VWG having a voltage corresponding to logic '0' applied to the gate of the switch $S_{GBL}$, the switch $S_{GBL}$ electrically decouples the global bit line GBL from the driving circuit. The signal VWG is a control signal for controlling the switch $S_{GBL}$. The signal VWG may be generated by a driving circuit (e.g., stripe controller 170 or bay controller 175). When the global bit line GBL is coupled to the driving circuit, a voltage VWR or VLOW may be supplied to the global bit line GBL. When the global bit line GBL is not coupled to the driving circuit, the global bit line GBL may be floated.

Figure 3:
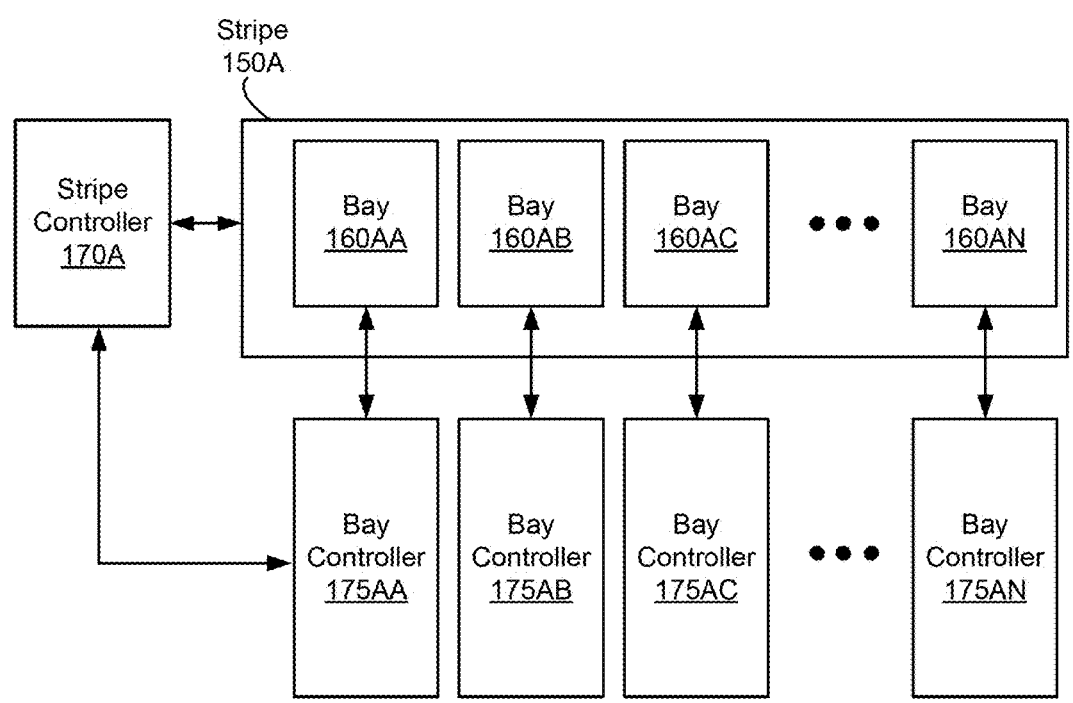
FIG. 3 is a block diagram of controllers controlling bays in a stripe according to an example embodiment.

Referring to FIG. 3, illustrated is a block diagram depicting a stripe controller 170A and bay controllers 175AA, 175AB . . . 175AN, which control bays 160AA, 160AB . . . 160AN in a stripe 150A, according to an example embodiment. Each of the bay controllers 175 is coupled to a corresponding bay 160 through a respective conductive connection. The stripe controller 170A is coupled to each of the bays 160AA-160AN through a common conductive connection, and is coupled to each of the bay controllers 175AA-175AN through another common conductive connection. In this configuration, these components operate together to supply various voltages (e.g., VLOW, VWR, VGWL, VUB, VUX, VWG of FIG. 2) or currents to memory cells in bays. In one aspect, each bay controller 175 can selectively supply a voltage or current to memory cells in a corresponding bay 160 for writing or reading data. The stripe controller 170A may control operations of the bay controllers 175 or directly provide a voltage or current to the bays 160.

Figure 4:
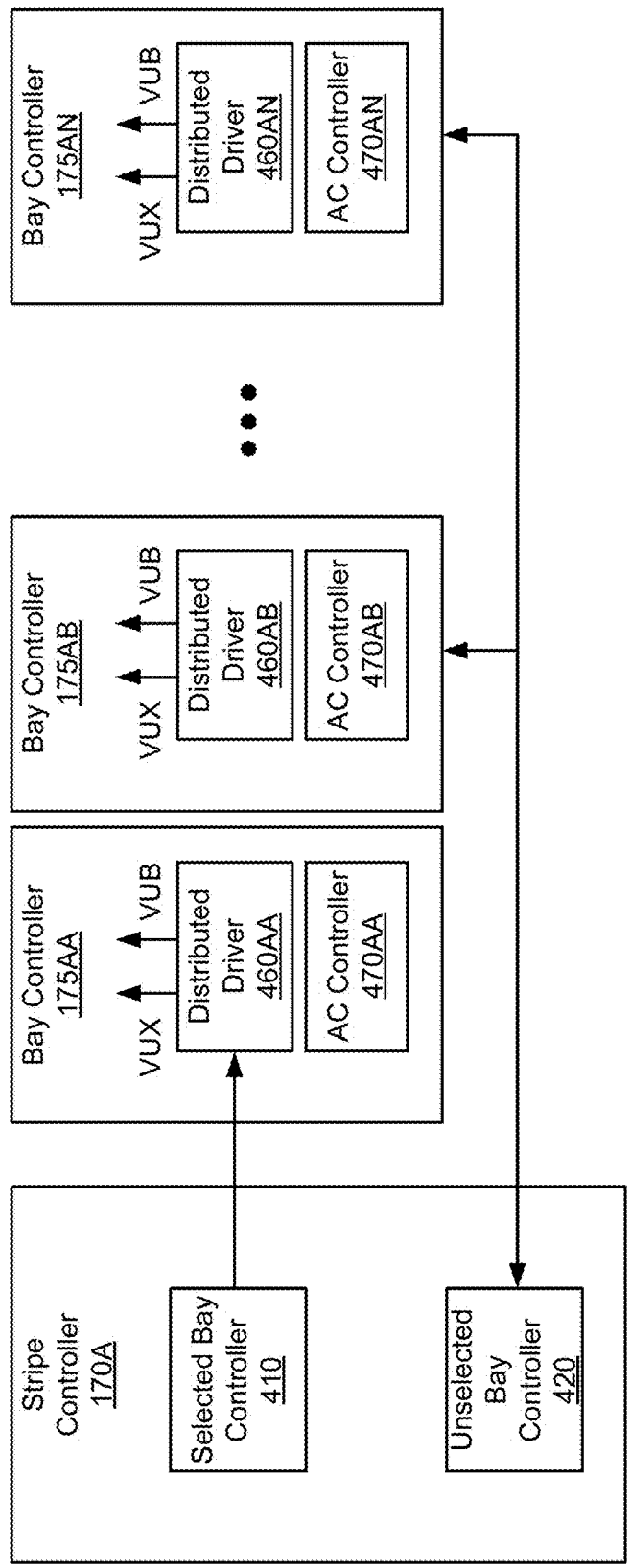
FIG. 4 is a circuit diagram of a stripe controller and bay controllers according to an example embodiment.

Referring to FIG. 4, illustrated is a circuit diagram of a stripe controller 170A and bay controllers 175A for generating voltages VUX and VUB for unselected word lines and unselected bit lines according to an example embodiment. Each of the bay controllers 175AA-175AN includes a distributed driver 460 and an AC controller 470. The distributed driver 460 is a circuit that supplies voltages (e.g., VUX, VUB, etc.) to memory cells in a corresponding bay. The AC controller 470 is a circuit that is coupled to the corresponding distributed driver 460 and controls the voltages of a corresponding distributed driver 460 to be within a predetermined range. The stripe controller 170A includes a selected bay controller 410 and an unselected bay controller 420. The selected bay controller 410 is a circuit that controls a distributed driver 460 of a bay controller 175 to output varying voltages at different phases. The unselected bay controller 420 is a circuit that controls remaining distributed drivers 460 of unselected bay controllers 175 to output relatively constant voltages. The selected bay controller 410 may be sequentially coupled to one of the bay controllers 175 in a stripe, or selectively coupled to a bay controller 175 associated with target memory cells for reading or writing data.

In some embodiments, the distributed driver 460 generates a voltage (e.g., VUX, etc.) in different voltage levels at different time periods, and the AC controller 470 and the selected bay controller 410 controls the voltage to be within predetermined ranges. The AC controller 470 may cause the voltage to settle within a first predetermined range (e.g., hundreds of millivolts). Once the voltage is within the first predetermined range, the selected bay controller 410 may further cause the voltage to settle within a second predetermined range (e.g., tens of millivolts) less than the first predetermined range. The AC controller 470 may be disabled, once the voltage is within the first predetermined range, thereby increasing the speed, efficiency, and accuracy of the memory device. The distributed driver 460, the AC controller 470, and the selected bay controller 410 may operate in a similar manner to provide other voltages (e.g., VUB, etc.) to the selected bay.

Figure 5:
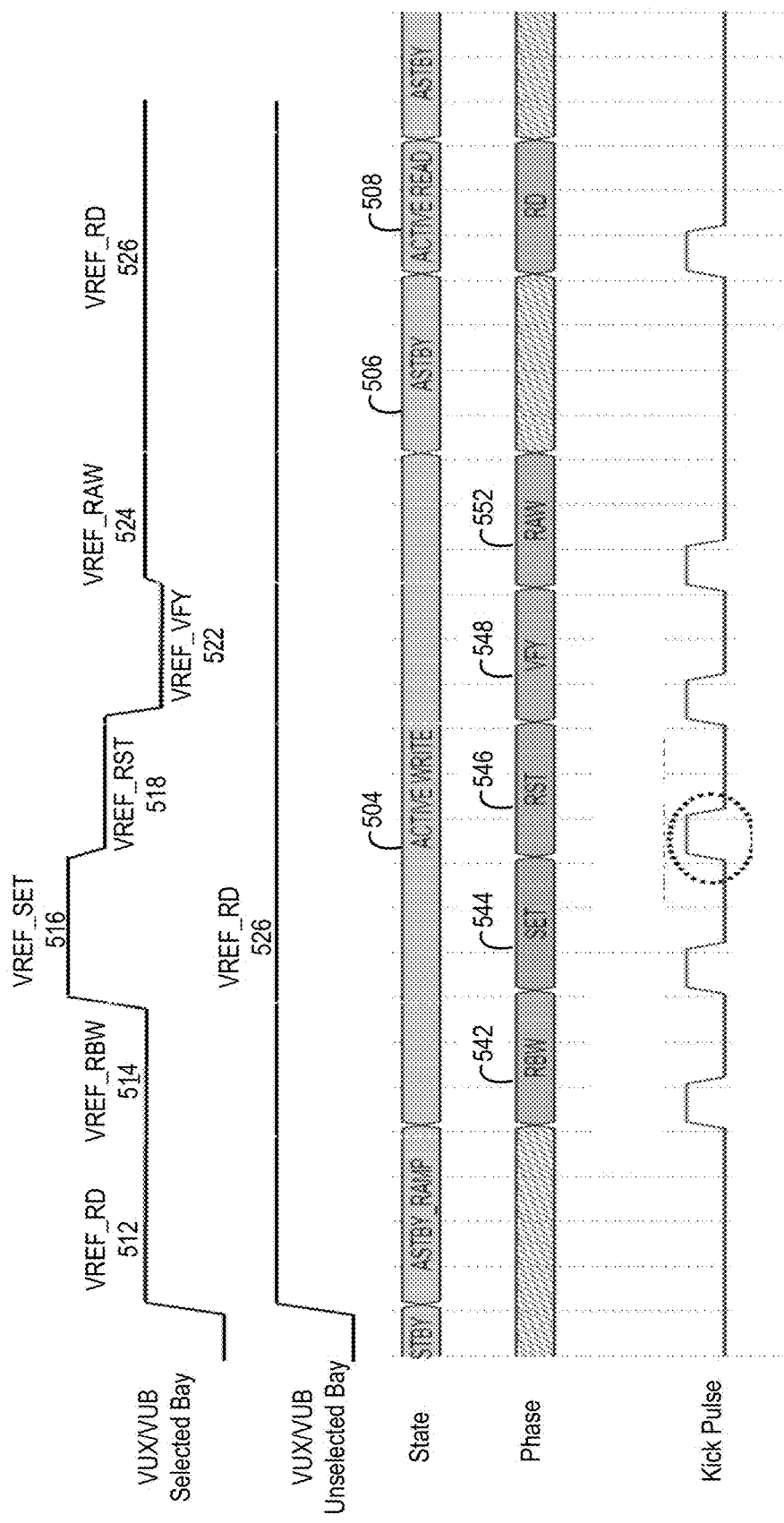
FIG. 5 is an example timing diagram of voltages applied to memory cells according to an example embodiment.

Referring to FIG. 5, illustrated is an example timing diagram of voltages applied to memory cells, according to an example embodiment. In one embodiment, the memory device 115 performs a write operation 504 and a read operation 508 at different time periods. The memory device 115 may be in standby 506 between the write operation 504 and the read operation 508. In some embodiments, the distributed drivers 460 output a relatively constant voltage (e.g., VREF_RD) during the standby 506 and the read operation 508 periods.

In some embodiments, the write operation 504 is performed through different phases: read before write (RBW) 542, SET 544, reset (RST) 546, verify (VFY) 548, and read after write (RAW) 552. Phases may be changed in response to a kick pulse. During different phases, the distributed drivers 460 may output voltages VUX and VUB at varying voltage levels (e.g., VREF_RD 512, VREF_RBW 514, VREF_SET 516, VREF_RST 518, VREF_VFY 522, VREF_RAW 524, VREF_RD 526) to selected memory cells, and output a constant reference voltage (e.g., VREF_RD 526) to unselected memory cells. The AC controller 470, the selected bay controller 410, or both may be configured to stabilize the output voltages at varying levels, while the unselected bay controller 420 maintains the reference voltage (e.g., VREF_RD 526) at a predetermined voltage level. In one aspect, improving an operation speed of a memory device 115 involves reducing settling time allocated for voltages changing in different phases to settle. Current loads, capacitive loads, or a combination of them may change during different phases, and configuring different voltages to settle within a short settling time (e.g., 100 ns) in different phases may be challenging. By employing the distributed AC controllers 470 and the selected bay controller 410, the voltages VUX and VUB with different voltage levels may be provided to memory cells with a short settling time (e.g., 100 ns).

Figure 6:
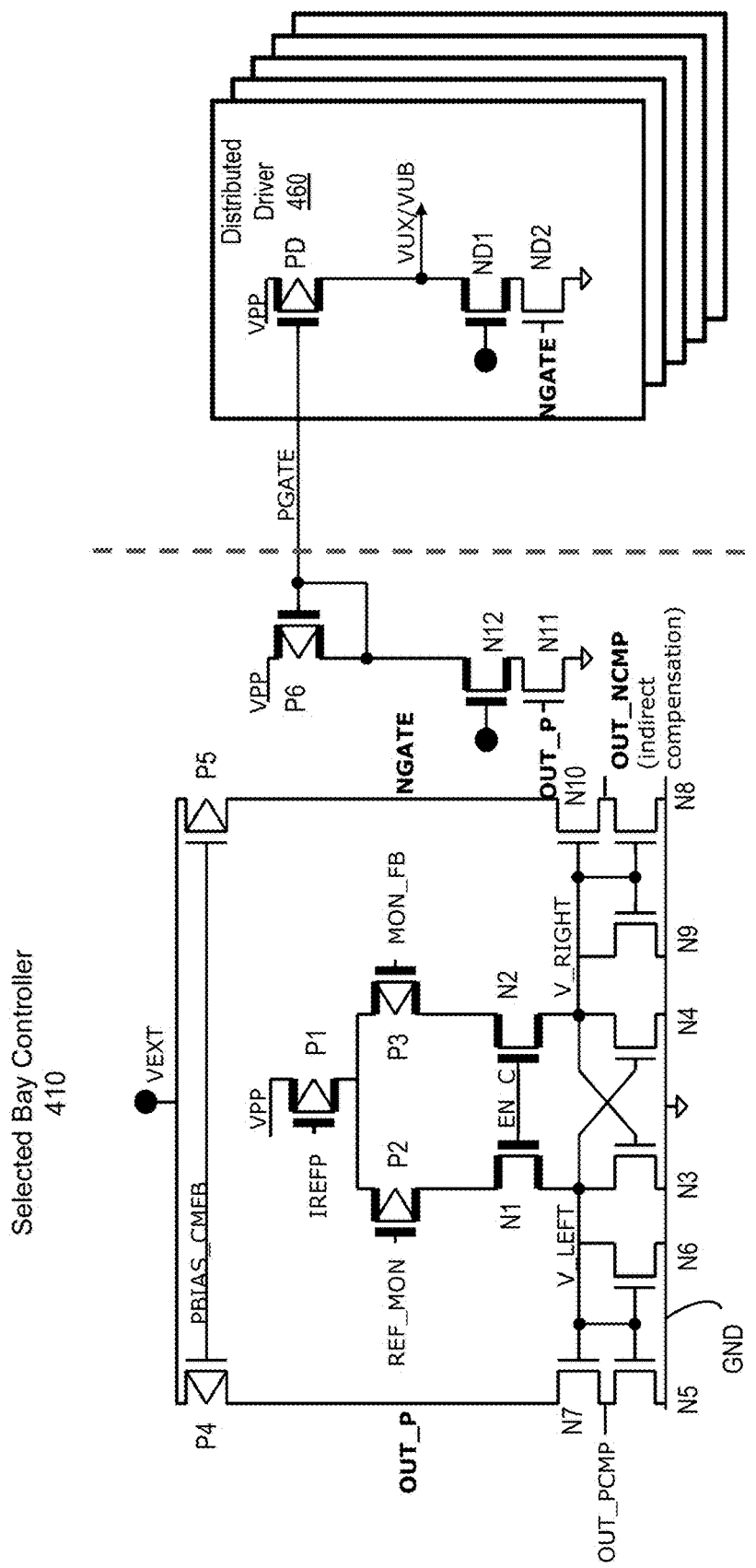
FIG. 6 is an example circuit diagram of a selected bay controller and a distributed driver according to an example embodiment.

Referring to FIG. 6, illustrated is an example circuit diagram of a selected bay controller 410 and a distributed driver 460, according to an example embodiment. In one embodiment, the selected bay controller 410 receives a signal MON_FB, and generates signals PGATE and NGATE according to the signal MON_FB, and provides the signals PGATE and NGATE to a selected one of the distributed drivers 460. The signal MON_FB is a signal indicative of the output voltage VUX/VUB, or both from the distributed driver 460. The signal MON_FB may be generated by the distributed driver 460. The distributed driver 460 receives the signals PGATE and NGATE from the selected bay controller 410, and generates a voltage VUX/VUB. In one aspect, the selected bay controller 410 and the selected distributed driver 460 form a feedback loop, and the selected bay controller 410 functions as a feedback loop control circuit to control the feedback operation.

In one embodiment, the selected bay controller 410 includes P-type transistors P1-P6, and N-type transistors N1-N12. P-type transistor may be a PNP transistor or a P-channel MOSFET, where N-type transistor may be an NPN transistor or an N-channel MOSFET. These components operate together to receive a target signal REF_MON and a feedback signal MON_FB, and generate signals PGATE and NGATE. The signal REF_MON is a signal indicative of a target voltage of VUX, VUB or both. The signal REF_MON may be generated by the stripe controller 170. The signals PGATE and NGATE are signals for controlling the distributed driver 460 to generate voltage VUX/VUB. In other embodiments, the selected bay controller 410 includes more, fewer, or different components than shown in FIG. 6. In other embodiments, some of P-type transistors shown in FIG. 6 may be implemented by N-type transistors, and some of N-type transistors shown in FIG. 6 may be implemented by P-type transistors.

In one configuration, the transistors P1, P2, P3, N1, N2, N3, and N4 form a first stage differential amplifier that receives the target signal REF_MON and the feedback signal MON_FB and generates a signal V_LEFT and a signal V_RIGHT according to the target signal REF_MON and a feedback signal MON_FB. The signal V_LEFT and the signal V_RIGHT indicate a relative voltage difference between the signal REF_MON and the signal MON_FB. For example, if the voltage of the REF_MON is lower than the voltage of the signal MON_FB, the voltage of the signal V_LEFT becomes higher than the voltage of the signal V_RIGHT, and vice versa.

In one implementation, a source terminal of the transistor P1 is coupled to a first voltage rail for receiving a power supply voltage VPP, a gate terminal of the transistor P1 is coupled to a conductive line for receiving a bias signal IREFP, a drain terminal of the transistor P1 is coupled to source terminals of transistors P2, P3. The bias signal IREFP is a signal that controls an amount of current flow through a transistor receiving the bias signal IREFP at its gate terminal (e.g., the transistor P1). The transistor P2 has a gate terminal coupled to a conductive line for receiving a signal REF_MON, and the transistor P3 has a gate terminal coupled to a conductive line for receiving a signal MON_FB. In addition, the transistor P2 has a drain terminal coupled to a drain terminal of the transistor N1, and the transistor P3 has a drain terminal coupled to a drain terminal of the transistor N2. The transistors N1, N2 have gate terminals coupled to a conductive line for receiving a signal EN_C. A signal EN_C is a signal to enable or disable current flow through the transistors P2, P3. The signal EN_C may be generated by a driving circuit (e.g., stripe controller 170). The transistor N1 includes a source terminal coupled to a drain terminal of the transistor N3, and the transistor N2 includes a source terminal coupled to a drain terminal of the transistor N4. The transistors N3, N4 are cross-coupled with each other to form a positive feedback, such that a gate terminal of the transistor N4 is coupled to the drain terminal of the transistor N3 and a gate terminal of the transistor N3 is coupled to the drain terminal of the transistor N4. Source terminals of the transistors N3, N4 are coupled to a second voltage rail for receiving a ground voltage GND.

The transistors P4, P5, N5, N6, N7, N8, N9, N10 form a second stage differential amplifier that receives the signals V_LEFT, V_RIGHT and generates signals OUT_P, NGATE according to the signals V_LEFT, V_RIGHT. The signal OUT_P and the signal NGATE indicate a relative voltage difference between the signal V_LEFT and the signal V_RIGHT. For example, if the voltage of the V_LEFT is higher than the voltage of the V_RIGHT, the voltage of the signal OUT_P becomes lower than the voltage of the signal NGATE, and vice versa.

In one implementation, the transistors N5, N6, N7, and P4 operate together to receive the signal V_LEFT and generate the signal OUT_P according to the signal V_LEFT. The transistor N6 includes a drain terminal coupled to the drain terminal of the transistor N3, a gate terminal coupled to the drain terminal of the transistor N3, and a source terminal coupled to the second voltage rail. The transistor N5 includes a gate terminal coupled to the drain terminal of the transistor N3, a drain terminal coupled to a source terminal of the transistor N7, and a source terminal coupled to the second voltage rail. The transistor N7 includes a gate terminal coupled to the drain terminal of the transistor N3, a drain terminal coupled to a drain terminal of the transistor P4, and the source terminal coupled to the drain terminal of the transistor N5. The transistor P4 includes the drain terminal coupled to the drain terminal of the transistor N7 and a gate terminal coupled to a conductive line for receiving a signal PBIAS_CMFB. The signal PBIAS_CMFB is a signal that controls an amount of current flow through the transistor P4. The signal PBIAS_CMFB may be generated by a driving circuit (e.g., stripe controller 170). The transistor P4 also includes a source terminal coupled to an external voltage rail to receive an external power supply voltage VEXT. Alternatively, the power supply voltage VPP is provided to the source terminal of the transistor P4 instead of the external power supply voltage VEXT. The transistors N8, N9, N10, and P5 are configured in a similar manner as the transistors N5, N6, N7, P4 to receive the signal V_RIGHT and output the signal NGATE according to the signal V_RIGHT. Therefore, the detailed description of duplicative portion is omitted for the sake of brevity.

The transistors N11, N12 and P6 form a conversion stage that converts a polarity of the signal OUT_P. For example, an increase in the voltage of the signal OUT_P causes a decrease in the voltage of the signal PGATE. In one implementation, the transistor N11 includes a gate terminal coupled to the drain terminals of the transistors P4 and N7 to receive the signal OUT_P. The transistor N11 also includes a source terminal coupled to the second voltage rail, and a drain terminal coupled to a source terminal of the transistor N12. The transistor N12 includes a gate terminal coupled to a conductive line to receive a bias voltage and a drain terminal coupled to a drain terminal of the transistor P6. The transistor P6 includes a source terminal coupled to the first voltage rail, a gate terminal coupled to the drain terminal of the transistor N12 to output the signal PGATE.

The distributed driver 460 receives the signals PGATE and NGATE, and generates the voltage VUX/VUB, or both, according to the signals PGATE and NGATE. In one implementation, the distributed driver 460 includes a transistor ND2 including a source terminal coupled to the second voltage rail, a gate terminal coupled to the drain terminals of the transistors N10 and P5 to receive the signal NGATE, and a drain terminal coupled to a source terminal of the transistor ND1. The transistor ND1 includes a gate terminal coupled to a conductive line for receiving a bias voltage and a drain terminal coupled to a drain terminal of the transistor PD. The transistor PD includes a gate terminal coupled to the gate terminal of the transistor P6 to receive the signal PGATE, and a source terminal coupled to the first voltage rail. The voltage at the drain terminal of the transistor PD or the drain terminal of the transistor ND1 is provided as the voltage VUX or VUB. By generating the voltage VUX/VUB according to the signals PGATE and NGATE, the voltage VUX/VUB can be increased by the transistor PD or decreased by the transistor ND2.

Figure 7A:
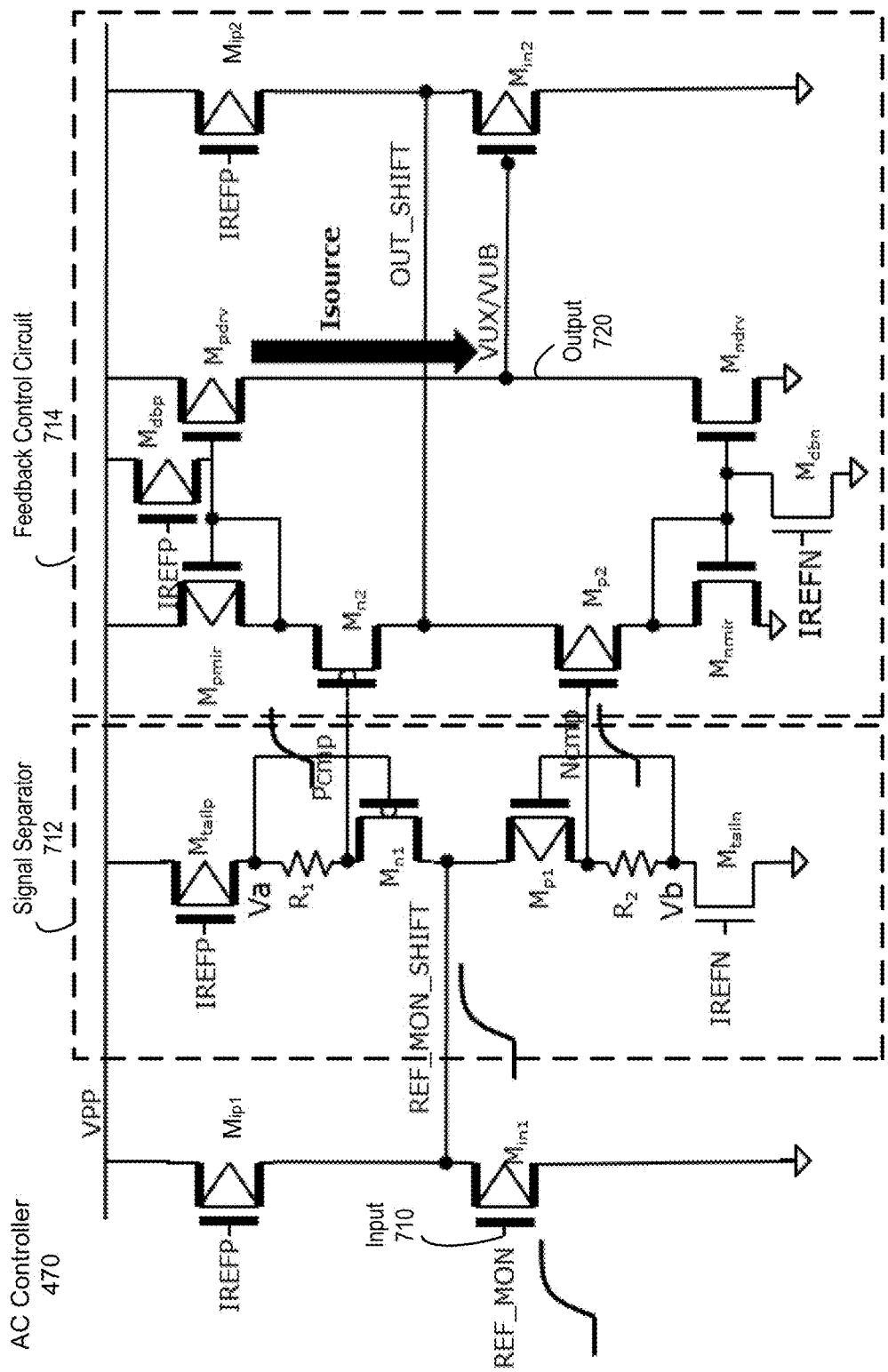
FIG. 7A is an example circuit diagram of an AC controller operating in response to a control signal according to an example embodiment.

Referring to FIG. 7A, illustrated is an example circuit diagram of an AC controller 470 operating in response to a control signal REF_MON, according to an example embodiment. The AC controller 470 includes an input 710 to receive a reference voltage and an output 720 to output a voltage VUX/VUB. The input 710 of the AC controller 470 may be any node, terminal, port, or any similar input component at which the AC controller 470 receives a reference voltage (e.g., signal REF_MON). The output 720 of the AC controller 470 may be any node, terminal, port, or similar output component, at which the AC controller 470 provides a voltage (e.g., VUX, VUB). The output of the AC controller 470 may be coupled to an output of a corresponding distributed driver 460. In one embodiment, the AC controller 470 receives the reference voltage, and generates the voltage at the output according to the reference voltage. In some embodiments, the AC controller 470 includes P-type transistors $M_{ip1}$, $M_{in1}$, $M_{tailp}$, $M_{p1}$, $M_{p2}$, $M_{pmir}$, $M_{dbp}$, $M_{pdrv}$, $M_{ip2}$, $M_{in2}$, N-type transistors $M_{n1}$, $M_{tailn}$, $M_{n2}$, $M_{nmir}$, $M_{dbn}$, $M_{ndrv}$, and resistors $R_1$, $R_2$. These components operate together to receive the control signal REF_MON and generate the voltage VUX/VUB, or both according to the signal REF_MON. In other embodiments, the AC controller 470 includes more, fewer or different components than shown in FIG. 7A. In other embodiments, some of P-type transistors shown in FIG. 7A may be implemented by N-type transistors, and some of N-type transistors shown in FIG. 7A may be implemented by P-type transistors.

In one configuration, the transistors $M_{ip1}$, $M_{in1}$, $M_{tailp}$, $M_{n1}$, $M_{p1}$, $M_{tailn}$, and resistors R1, R2 operate as an input splitting circuit that receives an input signal REF_MON and generates shifted signals Pcmp and Ncmp. The shifted signals Pcmp and Ncmp include AC components following the AC component of the signal REF_MON, but at different DC voltage levels. For example, the shifted signal Pcmp has a higher DC voltage level than the DC voltage level of the signal REF_MON, and the shifted signal Ncmp has a lower DC voltage level than the DC voltage level of the signal REF_MON. The signals Pcmp and Ncmp may have DC voltage levels suitable for input of the subsequence stage (e.g., transistor $M_{n2}$ and $M_{p2}$).

In one implementation, the transistor $M_{in1}$ operates as a source follower. The transistor $M_{in1}$ has a gate terminal coupled to a conductive line for receiving the signal REF_MON, and a drain terminal coupled to the second voltage rail. A source terminal of the transistor $M_{in1}$ is coupled to a drain terminal of the transistor $M_{ip1}$. The transistor $M_{ip1}$ has a source terminal coupled to the first voltage rail, and a gate terminal coupled to a conductive line for receiving a bias signal IREFP. In this configuration, the transistor $M_{in1}$ may receive the REF_MON signal and generate a shifted signal REF_MON_SHIFT. The shifted signal REF_MON_SHIFT includes AC component following the AC component of the signal REF_MON, and at a different DC level.

In one implementation, the transistors $M_{n1}$, $M_{p1}$, $M_{tailp}$, $M_{tailn}$, and resistors $R_1$, $R_2$, operate as a signal separator 712 that receives the shifted signal REF_MON_SHIFT and outputs signals $P_{CMP}$ and $N_{CMP}$. The shifted signals Pcmp and Ncmp include AC components following the AC component of the signal REF_MON_SHIFT, but at different DC levels. Source terminals of transistors $M_{n1}$, $M_{p1}$ are coupled to the source terminal of the transistor $M_{in1}$ to receive the signal REF_MON_SHIFT. A gate terminal of the transistor $M_{n1}$ is coupled to a drain terminal of the transistor $M_{n1}$ through a resistor $R_1$ to form a diode connected configuration. The gate terminal of the transistor $M_{n1}$ is also coupled to the drain terminal of the transistor $M_{tailp}$. The transistor $M_{tailp}$ has a source terminal coupled to the first voltage rail, and a gate terminal coupled to a conductive line for receiving a bias signal IREFP. Similarly, a gate terminal of the transistor $M_{p1}$ is coupled to a drain terminal of the transistor $M_{p1}$ through a resistor $R_2$ to form a diode connected configuration. The gate terminal of the transistor $M_{p1}$ is also coupled to the drain terminal of the transistor $M_{tailn}$. The transistor $M_{tailn}$ has a source terminal coupled to the second voltage rail, and a gate terminal coupled to a conductive line for receiving a bias signal IREFN. The bias signal IREFN is a signal that controls an amount of current flow through the transistor $M_{tailn}$. The bias signal IREFN may be generated by a driving circuit (e.g., the striper controller 170 or the bay controller 175).

In this configuration, the transistors $M_{n1}$, $M_{p1}$ operate as diodes and the transistors $M_{tailn}$, $M_{tailp}$ operate as current sources supplying DC current through the diodes. Hence, when an input incitation is received at the source terminals of the diode connected transistors $M_{n1}$, $M_{p1}$, voltages at drain terminals of the diode connected transistors $M_{n1}$, $M_{p1}$ follow the input incitation but at different DC levels (e.g., according to threshold voltages of the transistors $M_{n1}$, $M_{p1}$). The resistors $R_1$ and $R_2$ desensitize the transistors $M_{n1}$, $M_{p1}$, such that the transistors $M_{n1}$, $M_{p1}$ are inoperable or do not follow the signal REF_MON_SHIFT, if the voltage change in the signal REF_MON_SHIFT is less than a predetermined threshold determined according to the resistors $R_1$ and $R_2$ and the current supplied by the transistor $M_{tailn}$.

In one implementation, the transistors $M_{n2}$, $M_{pmir}$, $M_{pdrv}$, $M_{dbp}$, $M_{p2}$, $M_{nmir}$, $M_{ndrv}$, $M_{dbn}$, $M_{ip2}$ and $M_{in2}$ operate as a feedback control circuit 714 that controls the voltage VUX/VUB through feedback operation, according to the signals $P_{CMP}$ and $N_{CMP}$. In one aspect, the P-type transistor $M_{pmir}$, the N-type transistor $M_{n2}$, the P-type transistor $M_{p2}$, and the N-type transistor $M_{nmir}$ are coupled in series between the first voltage rail and the second voltage rail. The transistor $M_{n2}$ includes a gate terminal coupled to the drain terminal of the transistor $M_{n1}$, a drain terminal coupled to a drain terminal of the transistor $M_{pmir}$, and a source terminal coupled to a source terminal of the transistor $M_{p2}$. The transistor $M_{pmir}$ includes a gate terminal coupled to the drain terminal of the transistor $M_{pmir}$ and a gate terminal of the transistor $M_{pdrv}$. The source terminal of the transistor $M_{pmir}$ is coupled to the first voltage rail. The transistor $M_{pdrv}$ includes a source terminal coupled to the first voltage rail, and a drain terminal coupled to an output of the AC controller 470 for providing voltage VUX or VUB. The transistor $M_{dbp}$ includes a gate terminal coupled to a conductive line to receive the signal IREFP, a source terminal coupled to the first voltage rail, and a drain terminal coupled to the gate terminal of the transistor $M_{pdrv}$. Similarly, the transistor $M_{p2}$ includes a gate terminal coupled to the drain terminal of the transistor $M_{p1}$, a drain terminal coupled to a drain terminal of the transistor $M_{nmir}$, and a source terminal coupled to the source terminal of the transistor $M_{n2}$. The transistor $M_{nmir}$ includes a gate terminal coupled to the drain terminal of the transistor $M_{nmir}$ and a gate terminal of the transistor $M_{ndrv}$. The source terminal of the transistor $M_{nmir}$ is coupled to the second voltage rail. The transistor $M_{ndrv}$ includes a source terminal coupled to the second voltage rail, and a drain terminal coupled to the output of the AC controller 470 for providing voltage VUX or VUB. The transistor $M_{dbn}$ includes a gate terminal coupled to a conductive line to receive the signal IREFN, a source terminal coupled to the second voltage rail, and a drain terminal coupled to the gate terminal of the transistor $M_{ndrv}$.

In one aspect, the transistor $M_{n2}$ operates in a common source configuration with respect to the voltage Pcmp, where the current flows through the transistor $M_{n2}$ according to the voltage Pcmp. The transistor $M_{pmir}$ and the transistor $M_{pdrv}$ operate as a P-type current mirror circuit that mirrors a current flowing through the transistor $M_{n2}$. A P-type current mirror circuit is a current mirror circuit that includes P-type transistors. The size (e.g., channel width) of the transistor $M_{pdrv}$ may be larger than the transistor $M_{pmir}$ to achieve current amplification. For example, an increase in the voltage of the Pcmp causes a larger source current to the output of the AC controller 470. The larger source current causes an increase in the voltage VUX/VUB. The transistors $M_{p2}$, $M_{nmir}$, $M_{ndrv}$ operate in a similar manner as the transistors $M_{n2}$, $M_{pmir}$, $M_{pdrv}$, except a sink current Isink is provided to the output of the AC controller 470 in response to the voltage Ncmp. Specifically, the transistor $M_{p2}$ operates in a common source configuration with respect to the voltage Ncmp, where the current flows through the transistor $M_{p2}$ according to the voltage Ncmp. The transistor $M_{nmir}$ and the transistor $M_{ndrv}$ operate as an N-type current mirror circuit that mirrors a current flowing through the transistor $M_{p2}$. N-type current mirror circuit is a current mirror circuit that includes N-type transistors. The size (e.g., channel width) of the transistor $M_{ndrv}$ may be larger than the transistor $M_{nmir}$ to achieve current amplification. For example, a decrease in the voltage Ncmp causes an increase in the sink current Isink from the output of the AC controller 470. The larger sink current causes a decrease in the voltage VUX/VUB.

The transistors $M_{dbp}$ and $M_{dbn}$ may operate as switches to enable or disable the current mirroring by the transistors $M_{pmir}$, $M_{pdrv}$, $M_{nmir}$ and $M_{ndrv}$. For example, the transistors $M_{dbp}$ and $M_{dbn}$ may be opened to enable current mirroring by the transistors $M_{pmir}$, $M_{pdrv}$, $M_{nmir}$ and $M_{ndrv}$, according to voltage levels of the signals IREFP, IREFN. The transistor $M_{dbp}$ may couple the first voltage rail to the gate of the transistor $M_{pmir}$ and the transistor $M_{dbn}$ may couple the second voltage rail to the gate of the transistor $M_{nmir}$ according to voltage levels of the signals IREFP, IREFN to disable current mirroring.

The transistors $M_{in2}$ and $M_{ip2}$ operate as part of the feedback control circuit 714 to control the voltage VUX/VUB. Detailed operation of the feedback control is provided below with respect to FIG. 7B.

When the AC controller 470 is operational, the AC controller 470 generates a voltage corresponding to the target signal REF_MON. For example, an increase in the signal REF_MON causes an increase in the shifted signal REF_MON_SHIFT and an increase in the shifted signals Pcmp, Ncmp. According to the increase in the shifted signals Pcmp, Ncmp, the source current Isource through the $M_{pdrv}$ increases, and the sink current Isink through the $M_{ndrv}$ decreases. Thus, the voltage VUX/VUB increases according to the increase in the source current Isource. Similarly, a decrease in the signal REF_MON causes a decrease in the shifted signal REF_MON_SHIFT and a decrease in the shifted signals Pcmp, Ncmp. According to the decrease in the shifted signals Pcmp, Ncmp, the source current Isource through the $M_{pdrv}$ decreases, and the sink current Isink through the $M_{ndrv}$ increases. Thus, the voltage VUX/VUB decreases according to the increase in the sink current Isink.

Figure 7B:
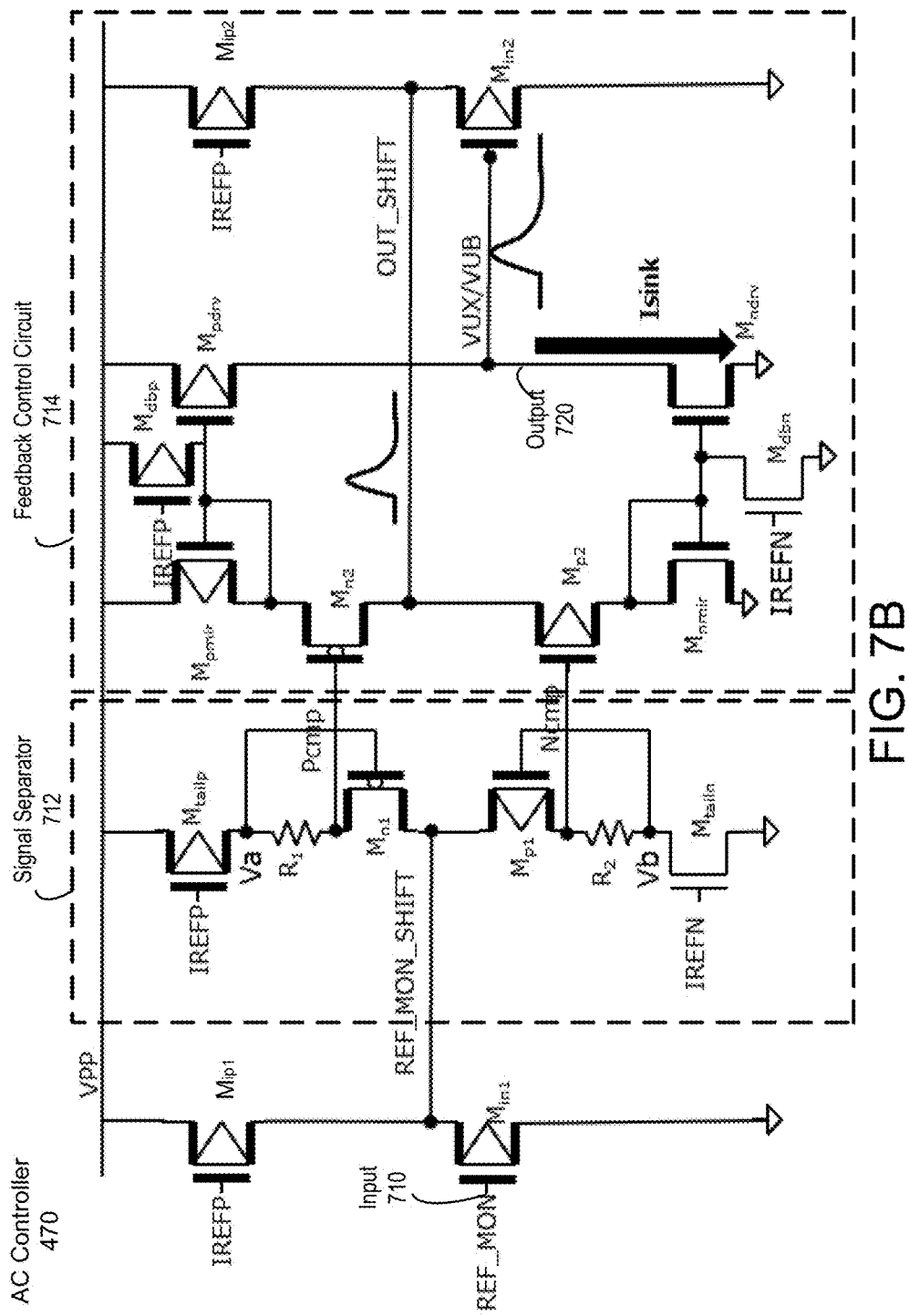
FIG. 7B is an example circuit diagram of the AC controller operating in response to output perturbation according to an example embodiment.

Referring to FIG. 7B, illustrated is an example circuit diagram of the AC controller 470 operating in response to output perturbation, according to an example embodiment. The AC controller 470 can respond to the perturbation at the output of the AC controller 470 to settle the voltage VUX/VUB in a prompt manner.

The transistors $M_{in2}$ and $M_{ip2}$ operate as part of the feedback control circuit 714 to control the voltage VUX/VUB. The transistor $M_{in2}$ includes a gate terminal coupled to the output of the AC controller 470, and a source terminal coupled to a drain terminal of the transistor $M_{ip2}$. A drain terminal of the $M_{in2}$ is coupled to the second voltage rail. The transistor $M_{ip2}$ includes a gate terminal coupled to the conductive line for receiving the signal IREFP, and a source terminal coupled to the first voltage rail. The source terminal of the transistor $M_{in2}$ and the drain terminal of the transistor $M_{ip2}$ are coupled to source terminals of the transistors $M_{n2}$ and $M_{p2}$.

In this configuration, the transistor $M_{in2}$ is a sense transistor that detects any changes in the voltage VUX/VUB, and configures current flowing through the current mirror circuits comprised of the transistors $M_{pmir}$, $M_{pdrv}$, $M_{nmir}$, $M_{ndrv}$ to adjust the source current Isource or sink current Isink to settle the voltage VUX/VUB at the output of the AC controller 470. In one aspect, the transistor $M_{in2}$ operates in a source follower configuration with respect to the voltage VUX/VUB to generate a signal OUT_SHIFT. The signal OUT_SHIFT is a signal having an AC component of the VUX, VUB at a difference DC level. The transistors $M_{n2}$, $M_{p2}$ operate in a common gate configuration with respect to the signal OUT_SHIFT. Assuming for an example that there is a sudden increase in the voltage VUX/VUB at the output of the AC controller 470, for example, due to charge injection. The increase in the voltage VUX/VUB causes an increase in the voltage of the signal OUT_SHIFT. The increase in the voltage of the signal OUT_SHIFT then causes an increase in the voltage at the gate terminals of the transistor $M_{pmir}$ and the transistor $M_{nmir}$, thereby causing an increase of the sink current Isink. The increased sink current Isink can negate the sudden increase in the voltage VUX/VUB to stabilize the voltage of VUX/VUB.

Advantageously, the AC controller 470 can operate with a fast response time due to a low impedance of the nodes. Generally, a high impedance of an amplifier may increase the DC gain, but does not improve the unity gain bandwidth (UGBW). In the AC controller 470 as disclosed herein, internal nodes except the output of the AC controller 470 have low impedances (e.g., on the order of 1/gm), and the amplification is achieved through the current amplification of current mirror circuits comprised of the transistors $M_{pmir}$, $M_{pdrv}$, $M_{nmir}$, $M_{ndrv}$. This allows the AC controller 470 to operate with an improved UGBW and the AC controller 470 to operate with high speed.

In one aspect, the stripe controller 170 is a means for selecting a distributed driver 460 from a plurality of distributed drivers. In addition, the AC controller 470 is a means for causing an output of the selected distributed driver 460 to be within a first predetermined range. Moreover, the resistors $R_1$ and $R_2$ of the AC controller 470 are means for disabling the AC controller 470 in response to the output of the distributed driver 460 being within the first predetermined range. For example, the resistors $R_1$ and $R_2$ disable the transistors $M_{n1}$, $M_{p1}$ to track input voltages within the first predetermined range by desensitizing the transistors $M_{n1}$, $M_{p1}$. The selected bay controller 410 is a means for causing the output of the selected distributed driver to be within a second predetermined range. The second predetermined range may be within the first predetermined range.

Figure 8:
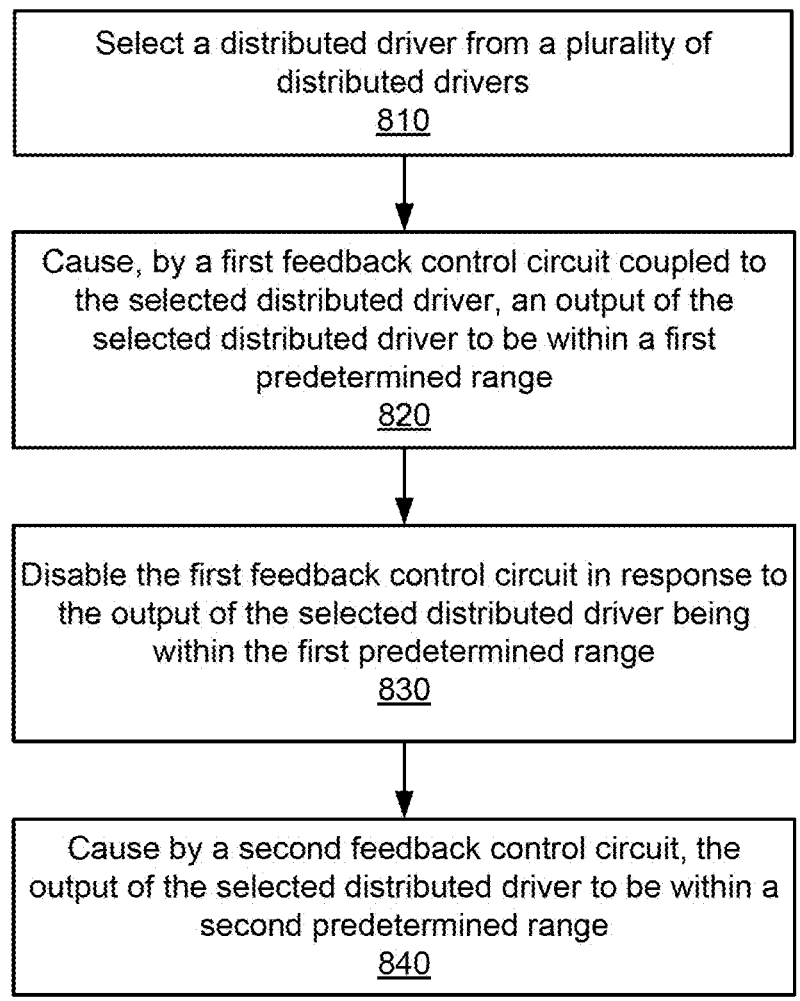
FIG. 8 is an example flow chart illustrating a process of operating a memory device according to an example embodiment.

Referring to FIG. 8, illustrated is an example flow chart illustrating a process 800 of operating a memory device, according to an example embodiment. The process 800 may be performed by the stripe controller 170 and the bay controller 175 of FIG. 1. In other embodiments, the process 800 may be performed by other components. In other embodiments, the process 800 may include more, fewer, or different steps than shown in FIG. 8.

The stripe controller 170 selects a distributed driver 460 from a plurality of distributed drivers in step 810. The distributed driver 460 is associated with a bay controller 175 for controlling corresponding memory cells. Different distributed drivers 460 may be sequentially selected, or a particular distributed driver 460 may be selected based on an address of target memory cells to perform memory read or memory write operations.

The bay controller 175 causes, by a first feedback control circuit 714 coupled to the selected distributed driver 460, an output of the selected distributed driver to be within a first predetermined range in step 820. The first feedback control circuit 714 may be an AC controller 470 coupled to the selected distributed driver 460. The AC controller 470 may be embodied and operate as described above with respect to FIGS. 7A and 7B.

The bay controller 175 disables the first feedback control circuit 714 in response to the output of the selected distributed driver being within the first predetermined range in step 830. For example, the resistors $R_1$ and $R_2$ of the AC controller 470 desensitize the transistors $M_{n1}$, $M_{p1}$, such that the transistors $M_{n1}$, $M_{p1}$ are inoperable for the first predetermined range.

The stripe controller 170 causes, by a second feedback control circuit (e.g., selected bay controller 410), the output of the selected distributed driver to be within a second predetermined range in step 840. The second predetermined range may be within the first predetermined range. The second feedback control circuit is selectively coupled to the distributed driver 460. The selected bay controller 410 may be embodied and operate as described above with respect to FIG. 6. The second feedback control circuit may operate after the bay controller 175 causes the output of the selected distributed driver to be within the first predetermined range. In one aspect, the first feedback control circuit 714 can operate over, for example, hundreds megahertz and is faster than the second feedback control circuit operating up to, for example, tens of kilohertz, but may be less accurate than the second feedback control circuit. By operating the first feedback control circuit 714 and the second feedback control circuit as disclosed herein, the voltage or the current provided to the memory cell can be adjusted with a reduced settling time, thereby improving the operating speed and accuracy of the memory device.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a selected distributed driver coupled to a set of memory cells, the selected distributed driver configured to bias the set of memory cells according to a voltage of an output of the selected distributed driver;
   a first feedback control circuit coupled to the selected distributed driver, the first feedback control circuit configured to maintain the voltage of the output of the selected distributed driver within a first predetermined voltage range; and
   a second feedback control circuit selectively coupled to the selected distributed driver and configured to maintain the voltage of the output of the selected distributed driver to be within a second predetermined voltage range, the second predetermined voltage range within the first predetermined voltage range.

2. The device of claim 1, wherein the first feedback control circuit is disabled responsive to the voltage of the output of the selected distributed driver being within the first predetermined voltage range.

3. The device of claim 1, further comprising:
   another distributed driver coupled to another set of memory cells, said another distributed driver to bias said another set of memory cells according to a voltage of an output of said another distributed driver.

4. The device of claim 3, wherein the first feedback control circuit is configured to stabilize the voltage of the output of the selected distributed driver in transition while the voltage of the output of said another distributed driver is maintained at a predetermined voltage level.

5. The device of claim 1,
   wherein the set of memory cells is divided into one or more stripes, each stripe of the one or more stripes comprising corresponding bays of memory cells, the device further comprising:
   a plurality of distributed drivers, each distributed driver of the plurality of distributed drivers coupled to a corresponding bay of the bays of memory cells; and
   a stripe controller including DC control circuits, the DC control circuits including the second feedback control circuit, the second feedback control circuit selectively coupled to the selected distributed driver from a set of the plurality of distributed drivers associated with a stripe of the one or more stripes.

6. The device of claim 1, wherein the first feedback control circuit comprises:
   a first N-type transistor including a gate terminal coupled to an input of the first feedback control circuit, wherein an increase in a voltage at the gate terminal of the first N-type transistor causes an increase in the voltage of the output of the selected distributed driver, and
   a first P-type transistor including a source terminal coupled to a source terminal of the first N-type transistor, wherein a decrease in a voltage at a gate terminal of the first P-type transistor causes a decrease in the voltage of the output of the selected distributed driver.

7. The device of claim 6,
   wherein the first feedback control circuit further comprises:
   a first voltage rail to supply a first supply voltage, and
   a second voltage rail to supply a second supply voltage, the second supply voltage lower than the first supply voltage,
   wherein the first N-type transistor is coupled between the first voltage rail and the first P-type transistor, and
   wherein the first P-type transistor is coupled between the second voltage rail and the first N-type transistor.

8. The device of claim 6, further comprising:
   a second N-type transistor in a diode connected configuration, the second N-type transistor including:
   a source terminal coupled to the input of the first feedback control circuit, and
   a drain terminal coupled to the gate terminal of the first N-type transistor, and
   a second P-type transistor in a diode connected configuration, the second P-type transistor including:
   a source terminal coupled to the source terminal of the second N-type transistor, and a drain terminal coupled to the gate terminal of the first P-type transistor.

9. The device of claim 8, further comprising:
a first resistor coupled between the drain terminal of the second N-type transistor and a gate terminal of the second N-type transistor, and
a second resistor coupled between the drain terminal of the second P-type transistor and a gate terminal of the second P-type transistor, the first resistor and the second resistor to disable the first N-type transistor and the first P-type transistor, responsive to the voltage of the output of the selected distributed driver being within the first predetermined voltage range.

10. The device of claim 6, wherein the first feedback control circuit further comprises:
a P-type current mirror circuit coupled to a drain terminal of the first N-type transistor, the P-type current mirror circuit configured to increase source current at the output of the selected distributed driver to increase the voltage of the output of the selected distributed driver, in response to the increase in the voltage at the gate terminal of the first N-type transistor, and
a N-type current mirror circuit coupled to a drain terminal of the first P-type transistor, the N-type current mirror circuit configured to increase sink current at the output of the selected distributed driver to decrease the voltage of the output of the selected distributed driver, in response to the decrease in the voltage at the gate terminal of the first P-type transistor.

11. The device of claim 6, wherein the first feedback control circuit further comprises:
a sense transistor in a source follower configuration, the sense transistor comprising:
a gate terminal coupled to the output of the selected distributed driver, and
a source terminal coupled to the source terminal of the first N-type transistor and the source terminal of the first P-type transistor.

12. A circuit comprising:
an input to receive a reference voltage;
an output to supply an output voltage corresponding to the reference voltage to a memory cell;
a first N-type transistor including a gate terminal coupled to the input of the circuit, wherein an increase in a voltage at the gate terminal of the first N-type transistor causes an increase in the output voltage;
a first P-type transistor including a source terminal coupled to a source terminal of the first N-type transistor, wherein a decrease in a voltage at a gate terminal of the first P-type transistor causes a decrease in the output voltage;
a second N-type transistor in a diode connected configuration, the second N-type transistor including:
a source terminal coupled to the input of the circuit, and
a drain terminal coupled to the gate terminal of the first N-type transistor; and
a second P-type transistor in a diode connected configuration, the second P-type transistor including:
a source terminal coupled to the source terminal of the second N-type transistor, and
a drain terminal coupled to the gate terminal of the first P-type transistor.

13. The circuit of claim 12, further comprising:
a first voltage rail to supply a first supply voltage; and
a second voltage rail to supply a second supply voltage, the second supply voltage lower than the first supply voltage,
wherein the first N-type transistor is coupled between the first voltage rail and the first P-type transistor, and
wherein the first P-type transistor is coupled between the second voltage rail and the first N-type transistor.

14. The circuit of claim 12, further comprising:
a first resistor coupled between the drain terminal of the second N-type transistor and a gate terminal of the second N-type transistor; and
a second resistor coupled between the drain terminal of the second P-type transistor and a gate terminal of the second P-type transistor, the first resistor and the second resistor to disable the first N-type transistor and the first P-type transistor, responsive to the output voltage being within a predetermined voltage range.

15. The circuit of claim 12, further comprising:
a P-type current mirror circuit coupled to a drain terminal of the first N-type transistor, the P-type current mirror circuit configured to increase source current at the output of the circuit to increase the output voltage, in response to the increase in the voltage at the gate terminal of the first N-type transistor; and
a N-type current mirror circuit coupled to a drain terminal of the first P-type transistor, the N-type current mirror circuit configured to increase sink current at the output of the circuit to decrease the output voltage, in response to the decrease in the voltage at the gate terminal of the first P-type transistor.

16. The circuit of claim 12, further comprising:
a sense transistor in a source follower configuration, the sense transistor comprising:
a gate terminal coupled to the output of the circuit, and
a source terminal coupled to the source terminal of the first N-type transistor and the source terminal of the first P-type transistor.

17. A method comprising:
selecting a distributed driver from a plurality of distributed drivers, each of the plurality of distributed drivers coupled to a corresponding one of a plurality of first feedback control circuits;
causing, by a first feedback control circuit of the plurality of first feedback control circuits coupled to the selected distributed driver, a voltage of an output of the selected distributed driver to be within a first predetermined voltage range;
disabling the first feedback control circuit in response to the voltage of the output of the selected distributed driver being within the first predetermined voltage range; and
causing, by a second feedback control circuit, the voltage of the output of the selected distributed driver to be within a second predetermined voltage range, the second predetermined voltage range within the first predetermined voltage range, wherein the second feedback control circuit is selectively coupled to the selected distributed driver.

18. A system comprising:
means for selecting a distributed driver from a plurality of distributed drivers, each of the plurality of distributed drivers coupled to a corresponding one of a plurality of first feedback control circuits;
means for causing a voltage of an output of the selected distributed driver to be within a first predetermined voltage range, the means for causing the voltage of the output of the selected distributed driver to be within the first predetermined voltage range coupled to the means for selecting the distributed driver from the plurality of distributed drivers;

means for disabling a first feedback control circuit of the plurality of first feedback control circuits coupled to the selected distributed driver, in response to the voltage of the output of the selected distributed driver being within the first predetermined voltage range; and means for causing the voltage of the output of the selected distributed driver to be within a second predetermined voltage range, the means for causing the voltage of the output of the selected distributed driver to be within the second predetermined voltage range selectively coupled to the selected distributed driver from the plurality of distributed drivers, the second predetermined within the first predetermined voltage range.

* * * * *